United States Patent [19]
Gorcea

[11] Patent Number: 6,107,884
[45] Date of Patent: Aug. 22, 2000

[54] LOW-DISTORTION HIGH-EFFICIENCY AMPLIFIER

[75] Inventor: Dan Gorcea, Kanata, Canada

[73] Assignee: Nortel Networks Corporation, Montreal, Canada

[21] Appl. No.: 09/200,435

[22] Filed: Nov. 27, 1998

[51] Int. Cl.[7] .................................................. H03F 1/14
[52] U.S. Cl. .......................... 330/255; 330/259; 330/261; 330/296
[58] Field of Search ................... 330/255, 259, 330/261, 296

[56] References Cited

U.S. PATENT DOCUMENTS

| | | | |
|---|---|---|---|
| 3,961,280 | 6/1976 | Sampei | 330/40 |
| 4,001,707 | 1/1977 | Iguchi | 330/18 |
| 4,484,147 | 11/1984 | Metz | 330/156 |
| 5,315,263 | 5/1994 | Mudra et al. | 330/156 |
| 5,786,729 | 7/1998 | Smith | 330/255 |

*Primary Examiner*—Michael B Shingleton

[57] ABSTRACT

The invention is an improvement to an amplifier configuration employing an amplification stage (e.g., an operational amplifier) biased via biasing terminals and a follower stage (e.g., an emitter-follower BJT pair), the follower stage being capable of producing the same voltage as the amplification stage but at a higher current. The improvement consists of feeding a fraction of the output voltage of the follower stage to the biasing terminals of the amplification stage. Specifically, the output of the follower stage is connected to the biasing terminals via a common bootstrap resistor and respective capacitors. The capacitors behave as a DC block and as an AC short-circuit. The biasing terminals are then connected to respective biasing resistors which could then be connected to respective supply voltage sources. In this way, the maximum permitted amplitude of the output voltage is increased, leading to less distortion and less frequent saturation of transistors in the amplification stage.

17 Claims, 3 Drawing Sheets

LOW-DISTORTION HIGH-EFFICIENCY AMPLIFIER

FIELD OF THE INVENTION

The present invention relates to high-speed analog power amplifiers and in particular to a power amplifier configuration which is capable of providing a rail-to-rail output voltage with very little distortion.

BACKGROUND OF THE INVENTION

In the telecommunications art, it is often necessary to amplify high-frequency analog signals for transmission across a medium such as copper wire. This is commonly achieved by using electronic circuits known as power amplifiers, which are biased by a supply voltage source. In an ideal scenario, power amplifiers operate at high speeds, produce very low distortion and are efficient in their power consumption.

Unfortunately, conventional power amplifiers are not capable of satisfying these three requirements. The most common problem is that the maximum output voltage falls several volts short of the supply voltage "rails", hence leading to poor power efficiency and effectively curtailing the input voltage range that can be linearly amplified by the power amplifier. When the input voltage exceeds this limit, certain transistors in the power amplifier may enter saturation, causing severe distortive effects.

Moreover, due to its random nature in many applications, the input voltage will fluctuate and drop to a level which requires previously saturated transistors to exit saturation and operate normally. Since recovery from saturation is an unstable process, the useful operating frequency range and dynamic range of the power amplifier are both severely limited.

For example, it is known that with supply voltage rails of plus and minus 10 volts, typical amplifiers (such as the OPA 642 from BurrBrown, the MAX 4187 from Maxim or the CLC 505 from National Semiconductor) are rather inefficient, as they are only capable of producing an output voltage swing of approximately 3 volts peak-to-peak while meeting distortion requirements at high frequencies of operation.

Thus there is a need for a power amplifier configuration that operates with high power efficiency, while continuing to provide high-speed functionality combined with very low distortion.

SUMMARY OF THE INVENTION

It is an object of the present invention to mitigate or obviate one or more disadvantages of the prior art.

Therefore, the invention may be summarized according to a first broad aspect as an amplifier configuration comprising: an amplification stage having one output, positive and negative biasing terminals and at least one input, for producing a signal at the output having a voltage level proportional to a function of the voltage levels at the at least one input; a follower stage having an input and an output, wherein the input of the follower stage is connected to the output of the amplification stage; a bootstrap resistor having one end connected to the output of the follower stage; first and second capacitors, one end of the first capacitor being connected to one end of the second capacitor and also to another end of the bootstrap resistor; a first biasing resistor having one end connected to another end of the first capacitor and also to the positive biasing terminal; and a second biasing resistor having one end connected to another end of the second capacitor and also to the negative biasing terminal.

According to a second broad aspect, the invention may be summarized as a method of biasing an amplification device, said device producing an intermediate voltage from an input voltage and being connected to a follower stage producing an output voltage which closely matches the intermediate voltage, the method comprising the step of delivering to a plurality of biasing terminals of said device a voltage that is approximately equal to the sum of a DC voltage and a fraction of the output voltage.

In an amplifier configuration comprising an amplification stage connected to a follower stage, the amplification stage having an output, a plurality of biasing terminals and at least one input, the follower stage having an input and an output, the input of the follower stage being connected to the output of the amplification stage, the invention may be summarized according to a third broad aspect as the improvement consisting of: connecting one end of a bootstrap resistor to the output of the follower stage; connecting one end of both a first and a second capacitor together and also to another end of the bootstrap resistor; connecting one end of a first biasing resistor to another end of the first capacitor and also to the positive biasing terminal; and connecting one end of a second biasing resistor to another end of the second capacitor and also to the negative biasing terminal.

BRIEF DESCRIPTION OF THE DRAWINGS

The preferred embodiment of the present invention will now be described with reference to the following figures, in which.

DETAILED DESCRIPTION OF THE PREFERRED EMBODIMENT

Figure 1:
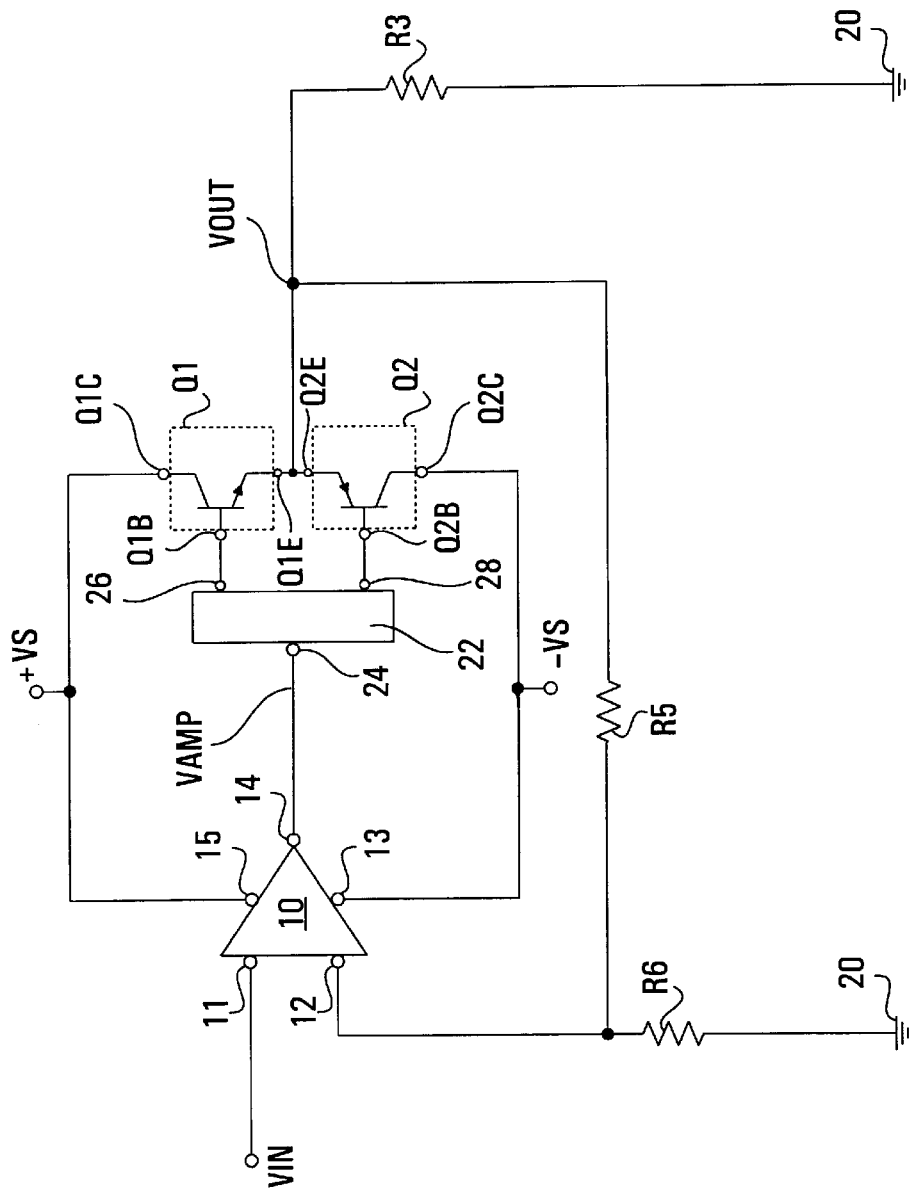
FIG. 1 is a circuit diagram representing a prior art power amplifier configuration.

FIG. 1 shows a high-speed power amplifier configuration commonly used in the prior art, consisting of an operational amplifier ("opamp") 10 having two input terminals 11,12, an output terminal 14, a positive biasing terminal 15 and a negative biasing terminal 13. The output terminal 14 is shown connected to a follower stage comprising a biasing circuit 22 and a pair of transistors $Q_1, Q_2$.

The positive biasing terminal 15 of the opamp 10 is connected to a positive supply voltage source (not shown) providing a constant positive DC (direct current) voltage $+V_S$ and the negative biasing terminal 13 is similarly connected to a negative supply voltage source (also not shown) providing a constant negative DC voltage. Typically, the negative DC voltage is equal in magnitude but opposite in sign to the positive DC voltage $+V_S$, and therefore equals $-V_S$.

Input terminal 11 is connected to a signal voltage source (not shown) providing an input voltage $V_{IN}$. Input terminal 12 is connected both to a resistor $R_5$ (having a resistance of $R_5$ ohms) and to a resistor $R_6$ (having a resistance of $R_6$ ohms) leading to a ground reference 20. Since a standard property of an opamp is for its output voltage to be equal to a magnified version of the difference between its input voltages, the output terminal 14 of opamp 10 accordingly has a voltage $V_{AMP}$ proportional to the difference between the input voltage $V_{IN}$ and the voltage at input terminal 12.

Transistors $Q_1$ and $Q_2$ are arranged in a well-known "emitter-follower" configuration. Both transistors are bipolar junction transistors (BJTs), $Q_1$ being an NPN BJT with a base $Q_{1B}$, an emitter $Q_{1E}$ and a collector $Q_{1C}$, and $Q_2$ being a PNP BJT with a base $Q_{2B}$, an emitter $Q_{2E}$ and a collector $Q_{2C}$. The collector $Q_{1C}$ of transistor $Q_1$ is connected to the positive supply voltage source and the collector $Q_{2C}$ of transistor $Q_2$ is connected to the negative supply voltage source. The two bases $Q_{1B}, Q_{2B}$ are connected to respective outputs 26,28 of the biasing circuit 22.

The two emitters $Q_{1E}, Q_{2E}$ are connected together and reside at a voltage $V_{OUT}$ which is supplied across a load. The load, in this case, is represented by a resistor $R_3$ having a resistance which depends on the application in question. The emitters $Q_{1E}, Q_{2E}$ are further connected to resistor $R_5$ leading to input terminal 12 of the opamp 10. $R_5$ and $R_6$ thus form a feedback path from the output of the emitter follower to the input of the opamp providing a feedback gain equal to $R_6/(R_5+R_6)$.

The biasing circuit 22 has an input terminal 24 connected to the output terminal 14 of the opamp 10 and, as mentioned, two output terminals 26,28 respectively connected to the bases $Q_{1B}, Q_{2B}$ of the transistors $Q_1, Q_2$. The purpose of the biasing circuit is to ensure that exactly one of the transistors $Q_1, Q_2$ of the emitter-follower conducts at all times, for any voltage $V_{AMP}$ present at the input terminal 24 of the biasing circuit 22.

In order to discuss operation of the prior art amplifier configuration in FIG. 1 and thereby to expose its shortcomings, it is suitable to determine the range of voltages which the opamp 10 is capable of supplying to the follower stage. In the positive sense, it is seen that $V_{AMP}$ cannot exceed the positive supply voltage $+V_S$ less a saturation voltage $V_{15-14,SAT}$ between the positive biasing terminal 15 and the output terminal 14 of the opamp 10. Since typical opamps comprise several amplification stages between the biasing terminals 15,13 and the output terminal 14, it is not unusual for $V_{15-14,SAT}$ to be on the order of 2 volts (or more). Similarly, a voltage drop $V_{13-14,SAT}$ having a value of approximately −2 volts (or less) is present between the negative biasing terminal 13 and the output terminal 14 of the opamp 10.

Therefore, the range for $V_{AMP}$ that can be supplied to the follower stage is between $(-V_S-V_{13-14,SAT})$ and $(V_S-V_{15-14,SAT})$ volts. (Incidentally, if the follower stage has been properly designed, then the output voltage $V_{OUT}$ perfectly follows $V_{AMP}$, except that a larger amount of current is available for driving the load $R_3$.) Since the range for $V_{AMP}$ (and for $V_{OUT}$) is several volts less than the range available from the supply rails, it becomes apparent that a conventional amplifier of the type illustrated in FIG. 1 operates in a highly inefficient manner.

However, as will now be shown, by inventively applying part of the voltage $V_{OUT}$ as a common mode voltage to the supply rails of the opamp 10, a wider output voltage range can be delivered to the follower stage without having to increase the supply voltage $V_S$. To this end, FIG. 2 shows a power amplifier configuration in accordance with the preferred embodiment of the present invention.

Figure 2:
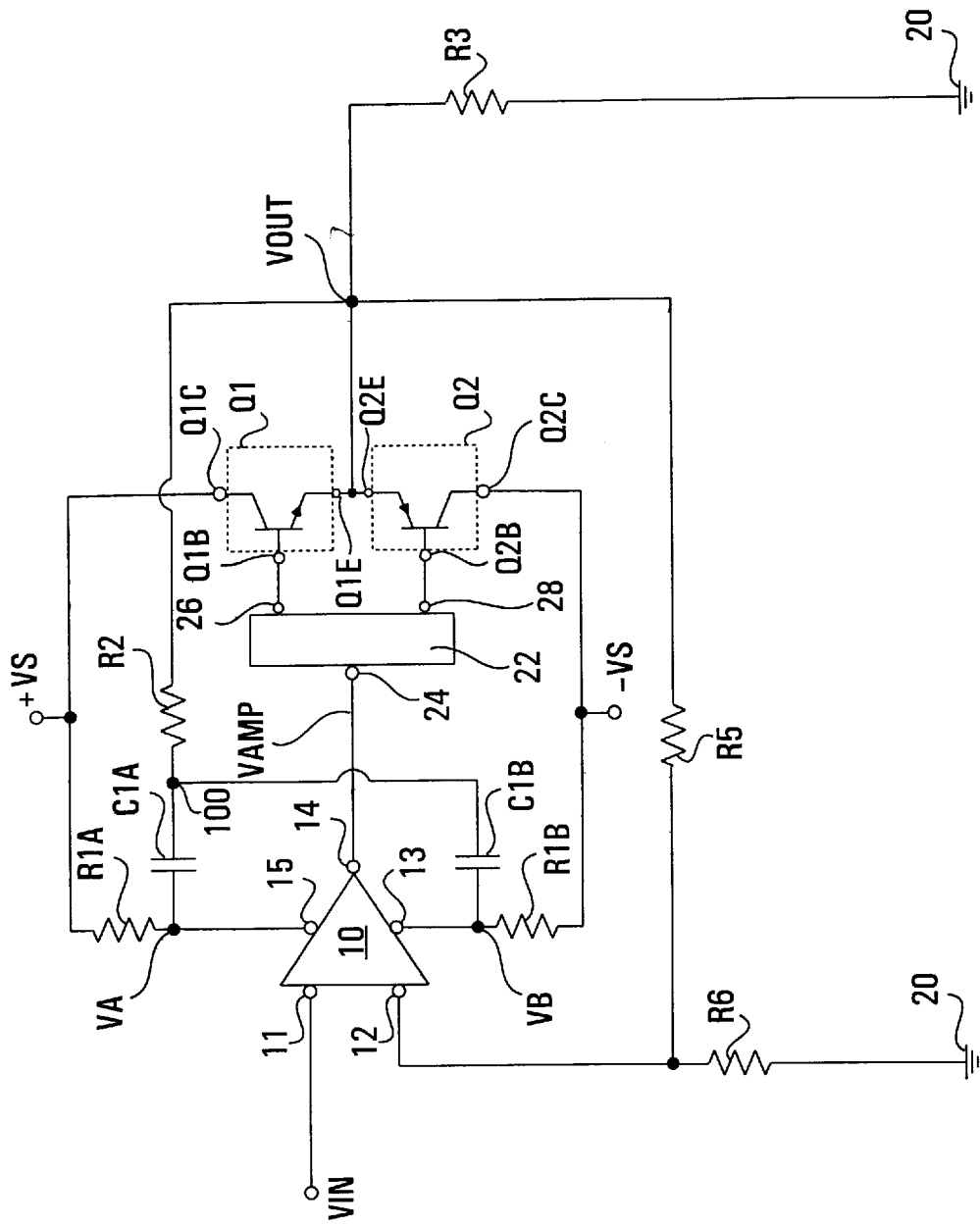
FIG. 2 is a circuit diagram representing a power amplifier configuration in accordance with the present invention.

As was the case with the prior art amplifier configuration in FIG. 1, the inventive configuration in FIG. 2 comprises an amplification stage and a follower stage. The amplification stage consists of an operational amplifier ("opamp") 10 having two input terminals 11,12, an output terminal 14, a positive biasing terminal 15 and a negative biasing terminal 13. The follower stage consists of an optional biasing circuit 22 connected to the output terminal 14 of the opamp as well as a pair of transistors $Q_1, Q_2$ configured as an emitter-follower and connected between the biasing circuit 22 and a load.

In FIG. 2, the load is represented by a resistor $R_3$ although, depending on the application, the load may also be capacitive, inductive or even active. The variety of loads to which the present invention applies includes, but is not limited to, twisted pair copper cables, coaxial cables and antennae.

The function of the follower stage is to produce an output voltage $V_{OUT}$ across the load which closely matches a voltage $V_{AMP}$ at the input to the follower stage (i.e., at the output terminal 14 of the opamp 10). In addition, the follower stage is to produce this voltage at a substantially higher current than that provided by the opamp, if required by the load. As known in the art, these conditions can be met by configuring the two transistors $Q_1, Q_2$ in an emitter-follower configuration.

The optional biasing circuit 22 comprises an input terminal 24 connected to the output terminal 14 of the opamp 10, as well as two output terminals 26,28. The purpose of the biasing circuit is to enable exactly one of the transistors $Q_1, Q_2$ of the emitter-follower to conduct at any given time. Any known biasing circuit may be used, and an appropriate method for constructing such a circuit may be found in Section 9.5 of the book "MICROELECTRONIC CIRCUITS", third edition, by A. S. Sedra and K. C. Smith, entitled "Biasing the Class AB Circuit", hereby incorporated by reference herein. (In the presence of the biasing circuit 22, the follower stage is known as a "class AB" circuit. If the biasing circuit is omitted, the follower stage is known as a "class B" circuit.)

The input terminal 11 of the opamp 10 is connected to a signal voltage source (not shown) providing an input voltage $V_{IN}$, which, in a preferred application of the present invention, will vary in accordance with an information signal. The output terminal 14 of the opamp 10 lies at a voltage $V_{AMP}$, which is proportional to the difference between $V_{IN}$ and the voltage at input terminal 12. The present invention also applies to the case wherein the input terminal 11 is grounded and the input terminal 12 is connected to an input signal source. In this case, it is recommended that the signal source be a current source or a voltage generator connected between resistor $R_6$ and ground 20. It is also to be considered that while usage of an operational amplifier is preferred, the opamp 10 may be replaced by any voltage amplification device requiring biasing and having an output voltage proportional to a function of one or more input voltages.

In accordance with the present invention, the positive biasing terminal 15 of the opamp 10 is connected via a first biasing resistor $R_{1A}$ to a positive supply voltage source (not shown) having a constant DC potential of $+V_S$ volts. The positive biasing terminal 15 is therefore supplied with a voltage $V_A$. Similarly, the negative biasing terminal 13, measurable at a potential $V_B$, is connected to a negative supply voltage source (not shown, providing a negative DC voltage) via a second biasing resistor $R_{1B}$. Preferably, biasing resistors $R_{1A}$ and $R_{1B}$ have an identical resistance, say, $R_1$. It is also preferable that the negative DC voltage be equal in magnitude but opposite in sign to the positive DC voltage $+V_S$, therefore equalling $-V_S$. A desirable value for $+V_S$ is on the order of 10 to 15 volts DC, although other ranges are equally suitable.

Within the emitter follower, transistors $Q_1$ and $Q_2$ are preferably bipolar junction transistors (BJTs), $Q_1$ being an NPN BJT with a base $Q_{1B}$, an emitter $Q_{1E}$ and a collector $Q_{1C}$, and $Q_2$ being a PNP BJT with a base $Q_{2B}$, an emitter $Q_{2E}$ and a collector $Q_{2C}$. The collector $Q_{1C}$ of transistor $Q_1$ is connected to the positive supply voltage source and the collector $Q_{2C}$ of transistor $Q_2$ is connected to the negative supply voltage source. The two bases $Q_{1B}, Q_{2B}$ are respectively connected to the two output terminals 26,28 of the biasing circuit 22.

The two emitters $Q_{1E}, Q_{2E}$ are connected together and reside at the voltage $V_{OUT}$ which is supplied across the load (in this case resistor $R_3$). The emitters $Q_{1E}, Q_{2E}$ are further connected to a resistor $R_5$ having a resistance of $R_5$ ohms, which is further connected to input terminal 12 of the opamp 10 and to another resistor $R_6$ (having a resistance of $R_6$ ohms) leading to a ground reference 20. Resistors $R_5$ and $R_6$ thus create a feedback path from the output of the emitter follower to the input of the opamp, providing a feedback gain equal to $R_6/(R_5+R_6)$. If a single-terminal device (e.g., a single input inverting amplifier) is used instead of the opamp 10, wherein one end of the input voltage source is connected to input terminal 12 and the input terminal 11 is grounded, then resistors $R_5$ and $R_6$ would be connected to the other end of the input voltage source.

It is to be understood that the type of feedback path used is not in any way essential to the functioning of the present invention. In fact, although some feedback is customarily present in a power amplifier configuration, it may be omitted without disadvantageously affecting the functionality of the present invention.

The emitters $Q_{1E}, Q_{2E}$ are also connected to one end of a bootstrap resistor $R_2$ having a resistance $R_2$, the other end of which is connected at an electrical junction point 100 to the positive biasing terminal 15 of the opamp 10 via a capacitor $C_{1A}$ and to the negative biasing terminal 13 via another capacitor $C_{1B}$. Capacitors $C_{1A}$ and $C_{1B}$ need not have identical capacitances, but should each have a large enough value so as to behave as a DC block and as an AC short circuit for the frequency range of interest.

Operation of the present invention is now described. In particular, it is most useful to determine the range for $V_{AMP}$ that can be supplied by the opamp to the follower stage. To this end, FIGS. 3A and 3B show signal diagrams for the amplifier configuration in FIG. 2, wherein the individual contributions of the supply voltage source and of the output voltage are considered, respectively.

Figure 3A:
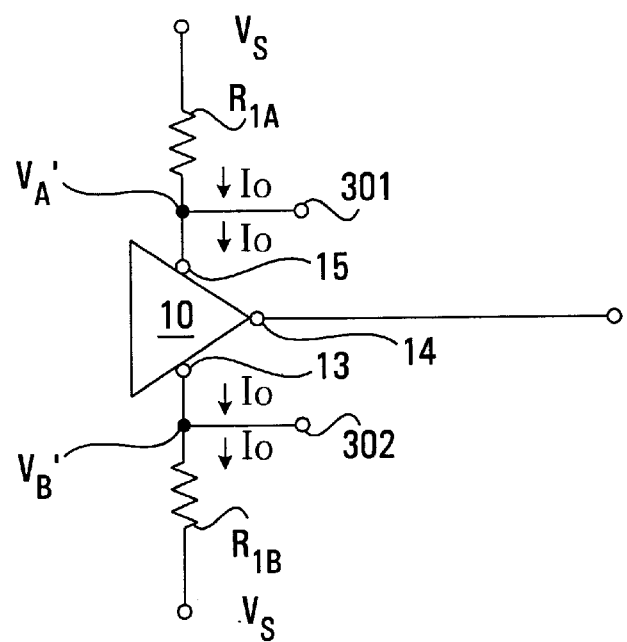
FIG. 3A is a signal diagram for analysis of the amplifier configuration in FIG. 2, showing the contribution of the supply voltage only.
Figure 3B:
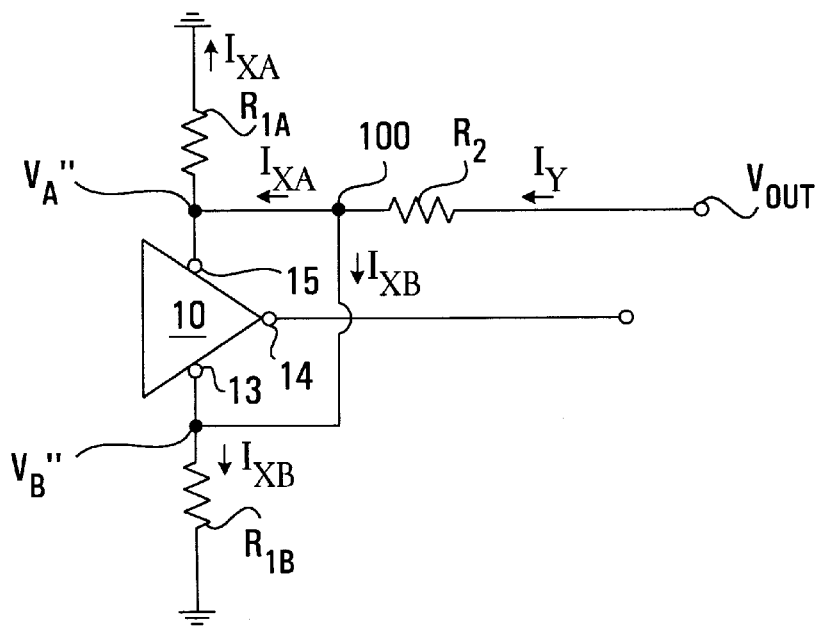
FIG. 3B is a signal diagram for analysis of the amplifier configuration in FIG. 2, showing the contribution of the output voltage only.

With reference first to FIG. 3A, it is noted that the supply voltage sources are constant DC voltage sources, and therefore the capacitors $C_{1A}$ and $C_{1B}$ may be replaced by respective open circuits 301,302. A DC biasing current $I_O$, usually constant and controllable, is supplied to the opamp 10. Therefore, the partial voltage $V_A'$ appearing at the positive biasing terminal 15 is:

$$V_A' = V_S - I_O R_1.$$

Similarly, the partial voltage $V_B'$ at the negative biasing terminal 13 of the opamp 10 is given by:

$$V_B' = -V_S + I_O R_1.$$

Reference is now made to FIG. 3B, which shows the contribution of the output voltage $V_{OUT}$ only. In this case, a current $I_Y$ travels through bootstrap resistor $R_2$ and is split at the electrical junction point 100 into two currents $I_{XA}, I_{XB}$ respectively passing through biasing resistors $R_{1A}$ and $R_{1B}$. As discussed, the capacitors $C_{1A}$ and $C_{1B}$ (from FIG. 2) may be selected such that they behave as short circuits for signals in a given frequency range. Also due to the AC short-circuit condition of the capacitors, the positive and negative biasing terminals 15,13 are at the same potential, and therefore no current enters the opamp 10 through these terminals.

By inspection of FIG. 3B, it is easy to observe that the partial voltages at the positive and negative biasing terminals 15,13 are respectively given by $V_A'' = I_{XA}$ times the resistance of the first biasing resistor $R_{1A}$ and $V_B'' = I_{XB}$ times the resistance of the second biasing resistor $R_{1B}$. Since the resistance of the first biasing resistor $R_{1A}$ is preferably equal to the resistance of the second biasing resistor $R_{1B}$, both resistors having a resistance $R_1$, it follows that $I_{XA} = I_{XB} = \frac{1}{2} I_Y$, leading to:

$$V_A'' = I_{XA} R_1$$

$$= \frac{1}{2} I_Y R_1$$

$$= \frac{1}{2} [V_{OUT} / (R_2 + R_1 // R_1)] R_1$$

$$= V_{OUT} R_1 / (R_1 + 2R_2).$$

Analogously, $V_B''$ is given by:

$$V_B'' = V_{OUT} R_1 / (R_1 + 2R_2).$$

Elementary circuit analysis then dictates that the partial voltages $V_A'$ and $V_A''$ can be combined to give the total voltage $V_A$ at the positive biasing terminal 15 of the opamp 10, that is to say:

$$V_A = V_S - I_O R_1 + V_{OUT} R_1 / (R_1 + 2R_2).$$

In a similar way, the total voltage at the negative biasing terminal 13 is found to be:

$$V_B = -V_S + I_O R_1 - V_{OUT} R_1 / (R_1 + 2R_2).$$

From the above, taking into account the voltage drop across the biasing terminals and the output terminals of the opamp, it is seen that the achievable range for $V_{AMP}$ is between $V_B - V_{13-14,SAT}$ and $V_A - V_{15-14,SAT}$ volts or, equivalently, between $$\left( -V_s + I_o R_1 - \frac{V_{OUT} R_1}{R_1 + 2R_2} - V_{13-14,SAT} \right) \text{ and }$$

$$\left( V_s - I_o R_1 + \frac{V_{OUT} R_1}{R_1 + 2R_2} - V_{15-14,SAT} \right)$$

volts. Recalling that the range for $V_{AMP}$ made available by the prior art amplifier configuration was limited to between $(-V_S - V_{13-14,SAT})$ and $(V_S - V_{15-14,SAT})$ volts, it is clear that the available range for $V_{AMP}$ has been expanded by $$\left( -I_o R_1 + |V_{OUT}| \frac{R_1}{R_1 + 2R_2} \right)$$

volts in both the positive and negative directions.

Of course, the fundamental limit achievable for the output voltage $V_{OUT}$ is reached when the voltage between the collector and emitter of either transistor $Q_1$ or $Q_2$ reaches a saturation voltage. Typical values for such a saturation voltage are on the order of 0.3 volts, allowing the output voltage $V_{OUT}$ to range from $-V_S+0.3$ to $V_S-0.3$ volts. In other words, the output voltage $V_{OUT}$ can practically touch the supply voltage rails.

From the above, it is clear that the inventive amplifier configuration shown in FIG. 2 has many advantages over the prior art. Firstly, for the same power supply voltage $V_S$, the inventive amplifier configuration permits substantially larger voltage swings than was permitted in the prior art, resulting in a higher efficiency of operation.

Furthermore, by controlling the DC biasing current $I_O$ and especially the values $R_1$ and $R_2$, it is possible to adjust the range of $V_{AMP}$ such that $V_{OUT}$ meets the voltage levels required by the load. At the same time, it is ensured that signal levels within the opamp do not exceed prescribed thresholds, leading to less frequent saturation of the transistors in the opamp and the emitter-follower, which allows for operation at higher frequencies and reducing distortion.

Another advantage of the present invention is that the total voltage available for biasing the opamp, that is to say $V_A-V_B$, is constant at $2(V_S-I_O R_1)$ volts. Beneficially, this is inferior to the total biasing voltage of $2V_S$ required by the prior art and therefore opamps having a lower power rating may be used, leading to further cost savings when the inventive amplifier configuration is employed. Also, constancy and controllability of $V_A-V_B$ allow the use of opamps having a lower power rating with large power supplies.

A further advantage of the present invention follows from the observation that $V_{AMP}$ as "seen" by the opamp 10 is $V_{AMP}*2R_2/(R_1+2R_2)$, which can be made to be a small fraction of $V_{AMP}$. Since the variability of $V_{AMP}$ relative to $V_A$ and $V_B$ is reduced, less expensive opamps having a smaller output voltage swing can be used.

While the preferred embodiment of the present invention has been described and illustrated, it will be apparent to one skilled in the art that numerous modifications and variations are possible. For example, as discussed, it is to be considered that different voltage amplification devices could be used in place of an operational amplifier, among which some may comprise only one input terminal.

Also, it is possible to use different types of follower stages, the only requirement being the capability of delivering, if necessary, a substantially larger current across the load than the current supplied to the input of the follower, at the same voltage. For instance, it is to be considered that the BJT transistors forming the emitter-follower may be replaced by field-effect transistors (FETs). Moreover, some follower stages may lack a biasing circuit while continuing to provide adequate functionality, although this may introduce a certain amount of so-called crossover distortion in the output signal and it may also lowers the maximum achievable output voltage by an amount equal to the biasing voltage which would normally be used.

In addition, changing the resistance of biasing resistor $R_{1A}$ and/or $R_{1B}$ (even reducing one of the values to zero) leads to a range for $V_{AMP}$ that is asymmetric about zero volts, which may be propitious under some circumstances. It may also be desirable to completely eliminate (i.e., open-circuit) either $R_{1A}$ or $R_{1B}$ (but not both), in which case the output voltage $V_{OUT}$ is applied to only one of the supply rails of the opamp. Asymmetric behaviour is also achievable by altering the voltages at which the positive and negative supply voltage sources operate. There is also an option of using a separate (larger) supply voltage source for the emitter-follower, which allows the output voltage to actually touch the supply rails of the opamp.

In view of the many further conceivable variations of the present invention, its scope is only to be limited by the claims appended hereto.

I claim:
1. An amplifier configuration comprising:
    an amplification stage having one output, positive and negative biasing terminals and at least one input, for producing a signal at the output having a voltage level proportional to a function of the voltage levels at the at least one input;
    a follower stage having an input and an output, wherein the input of the follower stage is connected to the output of the amplification stage;
    a bootstrap resistor having one end connected to the output of the follower stage;
    first and second capacitors, one end of the first capacitor being connected to one end of the second capacitor and also to another end of the bootstrap resistor;
    a first biasing resistor having one end connected to another end of the first capacitor and also to the positive biasing terminal; and
    a second biasing resistor having one end connected to another end of the second capacitor and also to the negative biasing terminal.
2. An amplifier configuration according to claim 2, wherein the amplification stage is an operational amplifier.
3. An amplifier configuration according to claim 1, wherein the follower stage produces a signal at the output of the follower stage having a voltage level closely matching the voltage level at the input to the follower stage and a current level substantially higher than the current level at the input to the follower stage.
4. An amplifier configuration according to claim 1, wherein the follower stage consists of a pair of bipolar junction transistors arranged as an emitter-follower.
5. An amplifier configuration according to claim 3, wherein the follower stage consists of a pair of bipolar junction transistors arranged as an emitter-follower.
6. An amplifier configuration according to claim 4, further comprising a biasing circuit connected between the amplification stage and the follower stage, for allowing exactly one of the transistors to conduct when a non-zero voltage is present at the output of the amplification stage.
7. An amplifier configuration according to claim 5, further comprising a biasing circuit connected between the amplification stage and the follower stage, for allowing exactly one of the transistors to conduct when a non-zero voltage is present at the output of the amplification stage.
8. An amplifier configuration according to claim 1, wherein the first and second biasing resistors are for connection to first positive and negative biasing power supplies, respectively, and wherein the follower stage further comprises a pair of biasing terminals for connection to second positive and negative biasing power supplies, respectively.
9. An amplifier configuration according to claim 8, wherein the first positive and second positive voltage supplies have an identical voltage and wherein the first negative and second negative power supplies have an identical voltage.
10. An amplifier configuration according to claim 1, wherein the first and second biasing resistors are for respective connection to first and second biasing power supplies and wherein the follower stage further comprises a pair of biasing terminals for respective connection to the first and second biasing power supplies.
11. An amplifier configuration according to claim 1, wherein the first and second biasing resistors have a substantially identical resistance.

12. An amplifier configuration according to claim 1, wherein the first and second capacitors have sufficiently large values to behave as open-circuit at DC and as a short-circuits at higher frequencies.

13. An amplifier configuration according to claim 1, wherein the number of inputs of the amplification stage is two and wherein one of the two inputs is connectable to an input voltage source and the other input is connectable to a ground reference.

14. An amplifier configuration according to claim 1, wherein the number of inputs of the amplification stage is two, wherein one of the two inputs is connectable to an input voltage source, the amplifier configuration further comprising:

a first feedback resistor connected between the other of the two inputs of the amplification stage and the output of the follower stage; and a second feedback resistor having one end connected to said other of the two inputs of the amplification stage and another end connectable to said ground reference.

15. A method of biasing an amplification device, said amplification device producing an intermediate voltage from an input voltage, said amplification device being connected to a follower stage producing an output voltage which closely matches the intermediate voltage, said amplification device comprising biasing terminals connectable to biasing sources via respective biasing resistors, the method comprising the step of feeding the output voltage to each biasing terminal via a respective capacitor and a common resistor.

16. In an amplifier configuration comprising an amplification stage connected to a follower stage, the amplification stage having an output, a plurality of biasing terminals and at least one input, the follower stage having an input and an output, the input of the follower stage being connected to the output of the amplification stage, the improvement consisting of:

connecting one end of a bootstrap resistor to the output of the follower stage;

connecting one end of both a first and a second capacitor together and also to another end of the bootstrap resistor;

connecting one end of a first biasing resistor to another end of the first capacitor and also to the positive biasing terminal; and connecting one end of a second biasing resistor to another end of the second capacitor and also to the negative biasing terminal.

17. An amplifier configuration comprising:

an amplification stage having an input, an output and a plurality of biasing terminals connectable to respective biasing sources by respective biasing resistors;

a follower stage having an input and an output, the input of the follower stage being connected to the output of the amplification stage; and a feedback path between the output of the follower stage and the biasing terminals of the amplification stage, said feedback path comprising a capacitor associated with each biasing terminal and a common resistor.

\* \* \* \* \*